(12) United States Patent
Yeo

(10) Patent No.: US 6,229,865 B1
(45) Date of Patent: May 8, 2001

(54) PHASE DIFFERENCE DETECTION CIRCUIT FOR LIQUID CRYSTAL DISPLAY

(75) Inventor: Jeong Beom Yeo, Seoul (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/105,972

(22) Filed: Jun. 26, 1998

(30) Foreign Application Priority Data

Jun. 30, 1997 (KR) .................................................. 97-30423

(51) Int. Cl.[7] ............................................................ H04L 7/00
(52) U.S. Cl. ............................ 375/375; 327/236; 331/14; 331/25
(58) Field of Search ........................... 375/326, 327, 375/375, 376; 327/231, 236, 237; 331/10, 14, 17, 25

(56) References Cited

U.S. PATENT DOCUMENTS

| | | | |
|---|---|---|---|
| 5,036,296 | * 7/1991 | Yoshida | 331/17 |
| 5,184,091 | * 2/1993 | Srivastava | 331/10 |
| 5,657,089 | 8/1997 | Onagawa | 348/537 |
| 5,760,844 | * 6/1998 | Jorden | 348/691 |
| 5,812,508 | * 8/2000 | Moon | 369/59 |
| 6,100,724 | * 8/2000 | Yoshimura et al. | 327/100 |

* cited by examiner

Primary Examiner—Young T. Tse
(74) Attorney, Agent, or Firm—Selitto, Behr & Kim

(57) ABSTRACT

A phase difference detection circuit of a phase locked loop (PLL) for liquid crystal display which compares a phase between external synchronous signal and an internal synchronous signal from the PLL to generate a phase difference detection signal, including: a phase comparison unit for comparing the phase between the external synchronous signal and the internal synchronous signal to generate the phase difference detection signal; an equalization pulse detection unit for detecting an equalization pulse from the external and internal synchronous signals and generating a control signal for controlling the output of the phase difference detection signal from the phase comparison unit according to an equalization pulse detection signal; an output selection unit for masking the phase difference detection signal from the phase comparison unit in an equalization period and providing the phase difference detection signal in a non-equalization period according to the control signal form the equalization pulse detection unit; and an equalization period ending detection unit for detecting an equalization period ending to generate an equalization period ending detection signal to the equalization pulse detection unit according to the control signal and the equalization pulse detection signal from the equalization pulse detection unit.

18 Claims, 4 Drawing Sheets

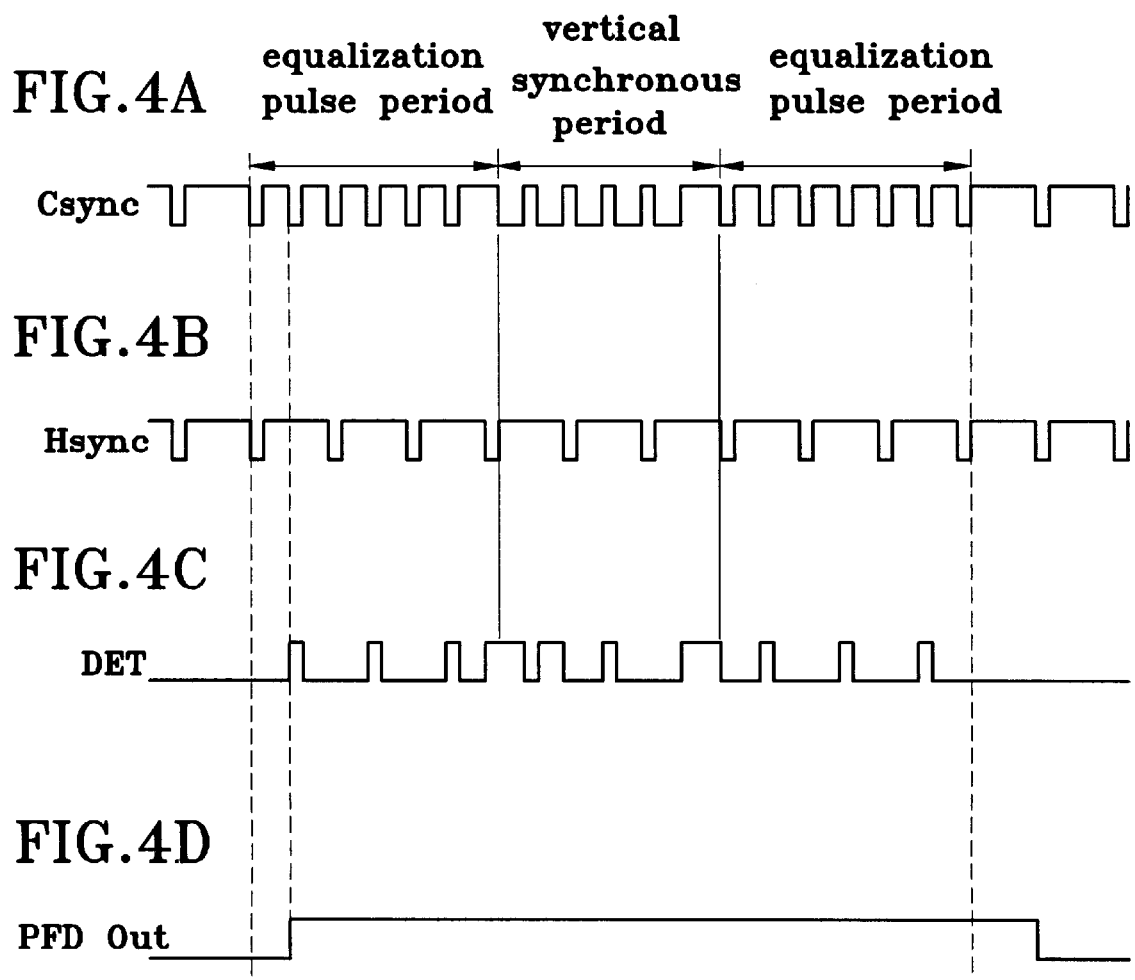

PHASE DIFFERENCE DETECTION CIRCUIT FOR LIQUID CRYSTAL DISPLAY

BACKGROUND OF THE INVENTION

This invention relates to a phase-locked loop (PLL) for liquid crystal displays (LCDs) which generates a master clock signal synchronized with an external synchronous signal, and more particularly to a phase difference detector for preventing the phase difference variation due to an equalization signal.

In general, thin film transistor-liquid crystal displays (TFT-LCDs) generate a master clock signal synchronized with an external synchronous signal through a PLL. FIG. 1 shows a block diagram of the prior PLL circuit for generating a master clock signal in TFT-LCDs. The prior PLL circuit compares the phase between an external synchronous signal Csync and an internal synchronous signal Hsync from a synchronous signal generator 60 through a phase difference detector 10 to generate a phase difference detection signal PFD.

A voltage controlled oscillator (VCO) 30 varies its oscillation frequency according to the phase difference detection signal PFD to generate the master clock MCLK. A sampling clock signal generator 70 receives the master clock signal MCLK from the VCO 30 through a buffer 40 to generate sampling clock pulse CPH for sampling R, G and B data. Accordingly, the prior PLL circuit generates the master clock signal MCLK synchronized with the synchronous signal Csync as the VCO 30 varies the frequency of the master clock signal MCLK according to the phase difference detection signal PFD generated from the phase difference detector 10.

However, if a composite synchronous signal is received as the external synchronous signal, the equalization period is exist in a vertical synchronous signal. Because the equalization pulse having a 1/H period is exist in the equalization period, if the phase difference detector compares the phase between two synchronous signals, the frequency of the VCO 30 is abruptly varied by the excessive phase variation. Although in the vertical synchronous signal period video signals are not displayed, it takes a long time to completely stabilize the abrupt frequency variation in the equalization period, thereby affecting the early display of video signals. Accordingly, the distortion is occurred in the upper end of a screen.

SUMMARY OF THE INVENTION

An object of the present invention is to provide a phase detector for LCD capable of being carrying out the stable phase difference detection by masking the phase difference detection operation in the equalization period of the composite synchronous signal.

According to an aspect of the present invention, there is provided to a phase difference detection circuit of a phase locked loop (PLL) for liquid crystal display which compares a phase between an external synchronous signal and an internal synchronous signal from the PLL to generate a phase difference detection signal, comprising: a phase comparison means for comparing the phase between the external synchronous signal and the internal synchronous signal to generate the phase difference detection signal; an equalization pulse detection means for detecting an equalization pulse from the external and internal synchronous signals and generating a control signal for controlling the output of the phase difference detection signal from the phase comparison means according to an equalization pulse detection signal; an output selection means for masking the phase difference detection signal from the phase comparison means in an equalization period and providing the phase difference detection signal in a non-equalization period according to the control signal received from the equalization pulse detection means; and an equalization period ending detection means for detecting an equalization period ending to generate an equalization period ending detection signal to the equalization pulse detection means according to the control signal and the equalization pulse detection signal received from the equalization pulse detection means.

The equalization pulse detection means includes: a detection means for detecting the equalization pulse from the external synchronous signal and the internal synchronous signal and providing the equalization pulse detection signal to the equalization period ending detection means; a control signal generation means for receiving the equalization pulse detection signal received from the detection means to generate the control signal for controlling the output of the phase difference detection signal generated from the phase comparison means to the output selection means and the equalization period ending detection means; and a trigger signal generation means for receiving the equalization period ending detection signal received from the equalization period ending detection means to generate the trigger signal for triggering the control signal generation means.

The detection means in the equalization pulse detection means comprises an exclusive OR gate for carrying out an exclusive OR logic of the external synchronous signal and the internal synchronous signal to generate the equalization pulse detection signal to the control signal generation means and the equalization period ending detection means.

The control signal generation means includes: a first flip flop where the equalization pulse detection signal received from the detection means is supplied as a clock signal and a power voltage is supplied as an input signal; an AND gate for carrying out an AND logic of an external reset signal and the internal synchronous signal to generate an output signal for clearing the first flip flop; and a second flip flop where an output signal of the first flip flop is supplied as a clock signal, the power supply is supplied as an input signal, the trigger signal received from the trigger signal generation means is supplied as a clear signal and the control signal is generated as an output signal to the output selection means and the equalization period ending detection means.

The trigger signal generation means includes: a third flip flop where the equalization period ending detection signal is supplied as a clock signal, the power supply is supplied as an input signal and the trigger signal is generated as an output signal to the second flip flop; and an NAND gate for carrying out an NAND logic of the internal synchronous signal and the control signal received from the control signal generation means to generate an output signal for clearing the third flip flop.

The output selection means comprises a multiplexer which receives an signal for masking the phase difference detection signal generated from the phase comparison and the phase difference detection signal as two input signals and provides the masking signal in the equalization period or the phase difference detection signal in the non-equalization period as the output signal of the phase difference detection circuit according to the control signal.

The equalization period ending detection means comprises a counter means for counting the master clock signal received from the PLL by a desired number to generate the equalization period ending detection signal. The counter means of the equalization period ending detection means includes a plurality of D filp flops connected in cascade for dividing the master clock signal by 512 to detect the equalization period ending detection signal, each of the D flip flops where an output signal inverted is fed back to an input signal. Each of the D flip flops where the equalization pulse detection signal received from the equalization pulse detection means is supplied as a clear signal, the control signal is supplied as an enable signal and the output signal inverted of the preceding D flip flop is supplied as a clock signal.

There is provided to a phase difference detection circuit of a phase locked loop (PLL) for a liquid crystal display, which compares a phase between an external synchronous signal and an internal synchronous signal from the PLL to generate a phase difference detection signal, comprising: a phase comparison means for comparing the phase between the external synchronous signal and the internal synchronous signal to generate the phase difference detection signal; an equalization pulse detection means for detecting an equalization pulse, the equalization pulse detection means including a detection means for receiving the external and internal synchronous signals to detect the equalization pulse, a control signal generation means for generating a control signal according to an equalization pulse detection signal generated from the detection means, and a trigger signal generation means for receiving an equalization period ending detection signal and the control signal from the control signal generation means to generate a trigger signal for triggering the control signal generation means; an output selection means for selecting and providing a masking signal for masking an output of the phase difference detection signal generated from the phase comparison means in an equalization period or for selecting and providing the phase difference detection signal in a non-equalization period according to the control signal received from the control signal generation means; and an equalization period ending detection means for counting a master clock signal from the PLL to detect the equalization period ending and for generating an equalization period ending detection signal to the trigger signal generation means of the equalization pulse detection means, the equalization period ending detection means including a counter means which is cleared by the equalization pulse detection signal generated from the detection means of the equalization pulse detection means and is enabled by the clock signal generated from the control signal generation means.

There is also provided to a phase difference detection circuit of a phase locked loop (PLL) for a liquid crystal display, which compares a phase between an external synchronous signal and an internal synchronous signal from the PLL to generate a phase difference detection signal, comprising: a phase comparison means for comparing the phase between the external synchronous signal and the internal synchronous signal to generate the phase difference detection signal; an equalization pulse detection means for detecting an equalization pulse from the external and internal synchronous signals and generating a control signal for controlling the output of the phase difference detection signal from the phase comparison means according to an equalization pulse detection signal; an output selection means for selecting and providing an external masking signal for masking the output of the phase difference detection signal from the phase comparison means in an equalization period or selecting and providing the phase difference detection signal in a non-equalization period according to the control signal form the equalization pulse detection means; and an equalization period ending detection means for counting a master clock signal from the PLL to detect an equalization period ending and providing an equalization period ending detection signal to the equalization pulse detection means according to the control signal and the equalization pulse detection signal from the equalization pulse detection means;

wherein in starting of the equalization period of the external synchronous signal, the equalization pulse detection means generates the equalization pulse detection signal for clearing the equalization period ending detection means and then generates the control signal to the output selection means and the equalization period ending detection means, thereby generating the masking signal through the output selection means and enabling the equalization period ending detection means, and in ending of the equalization period of the external synchronous signal, the equalization period ending detection signal generates the equalization period ending detection signal to the equalization pulse detection means and then the equalization pulse detection means generates the control signal, thereby generating the phase difference detection signal through the output selection means.

BRIEF DESCRIPTION OF THE DRAWINGS

Further objects and advantages of the present invention will be apparent from the following description, reference being had to the accompanying drawings wherein a preferred embodiment of the present invention is clearly shown.

In the drawings:

FIG. 4A through FIG. 4D are operational timing diagrams of the phase difference detection circuit.

DETAILED DESCRIPTION OF THE PREFERRED EMBODIMENT

Figure 1:
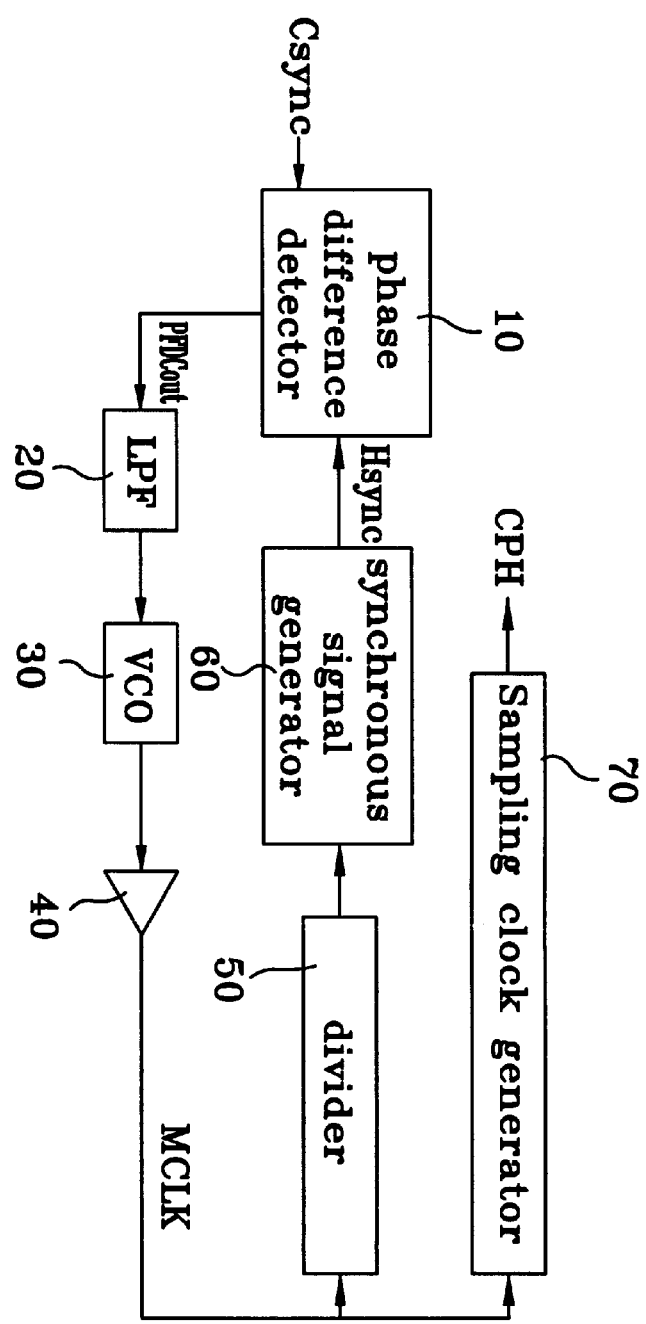
FIG. 1 is a block diagram of a conventional PLL circuit for TFT-LCDs.
Figure 2:
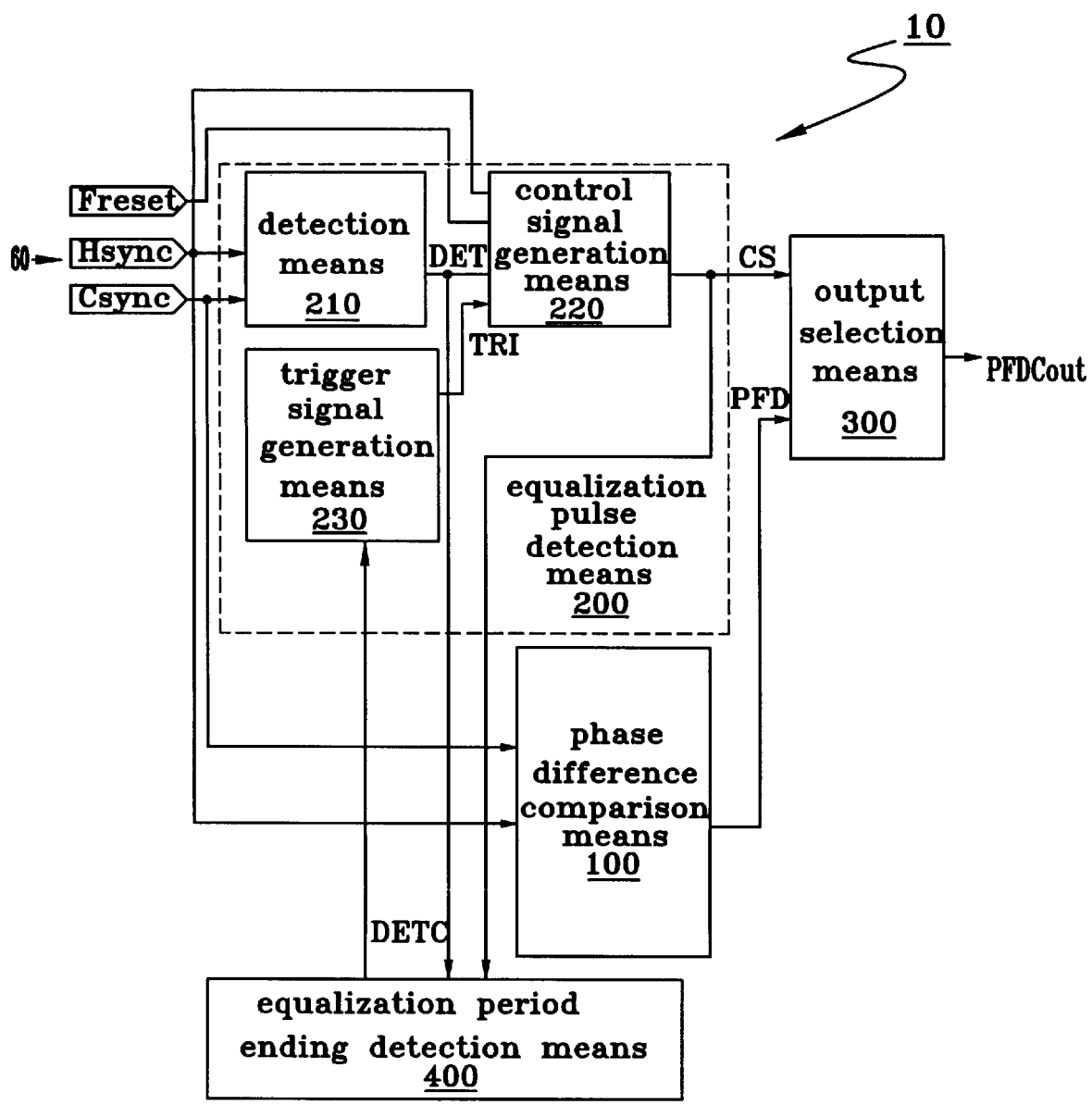
FIG. 2 is a block diagram of a phase difference detection circuit for TFT-LCDs in accordance with an embodiment of the present invention.
Figure 3:
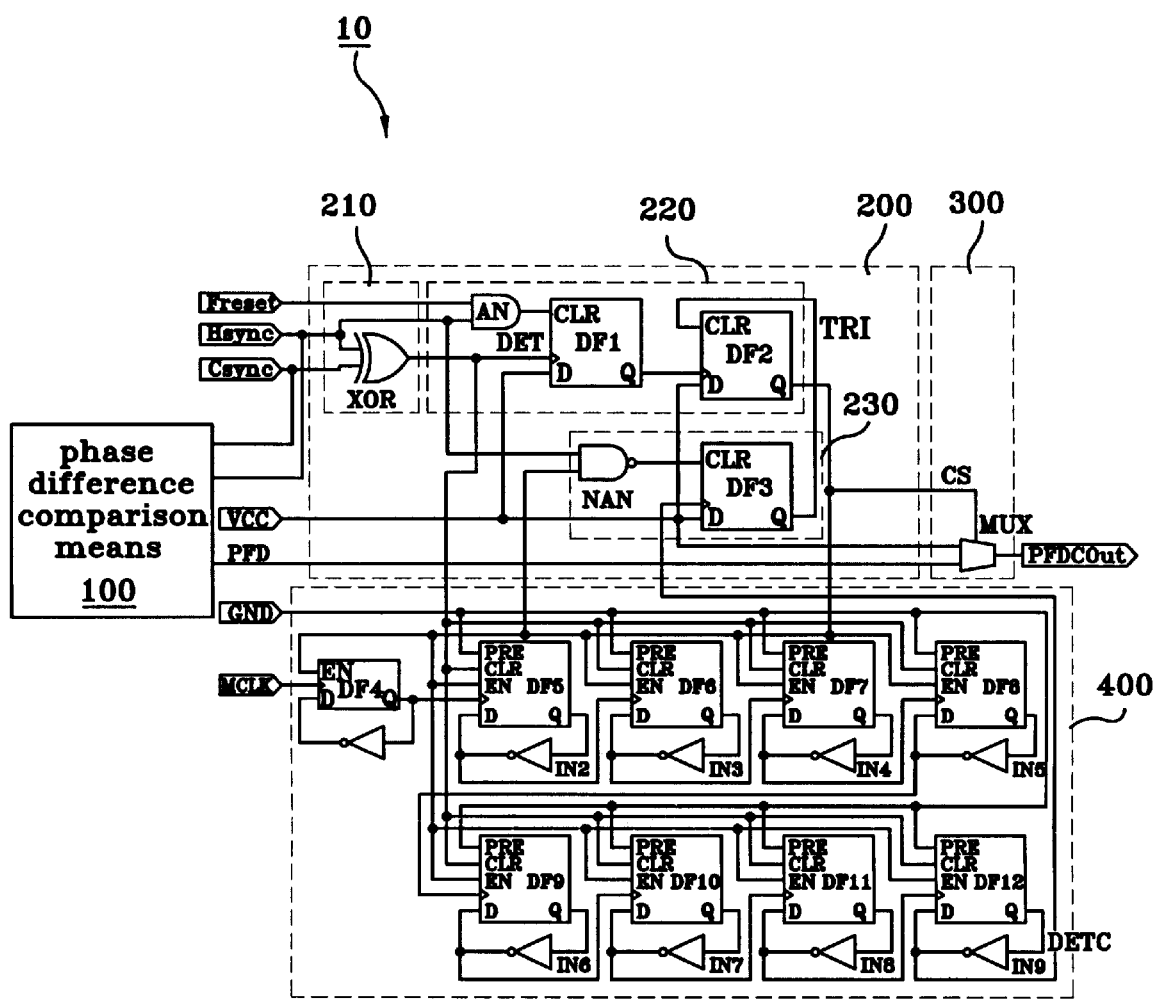
FIG. 3 is a detailed circuit diagram of the phase difference detection circuit of FIG. 2.

FIG. 2 is a block diagram of a phase difference detection circuit in PLL circuits of TFT-LCDs in accordance with an embodiment of the present invention and FIG. 3 is a detailed circuit diagram of the phase difference detection circuit in FIG. 2. The phase difference detection circuit comprises a phase comparison portion 100, an equalization pulse detection portion 200, an output section portion 300 and an equalization period ending detection portion 400. The phase comparison portion 100 compares a phase between an external synchronous signal Csync and an internal synchronous signal Hsync generated from the synchronous signal generator 60 to generate a phase difference detection signal PFD.

The equalization pulse detection portion 200 detects an equalization pulse from the external synchronous signal Csync and the internal synchronous signal Hsync, provides the equalization pulse detection signal DET to the equalization period ending detection portion 400, and generates the control signal CS for controlling output of the phase difference detection signal.

The output selection portion 300 generates a masking signal for masking the output of the phase difference detection signal PFD from the phase comparison portion 100 in an equalization period or generates the phase difference detection signal PFD from the phase comparison portion 100 in non-equalization period according to the control signal CS received from the equalization pulse detection portion 200. The equalization period ending detection portion 400 is enabled by the control signal CS from the equalization pulse detection portion 200 to detect the equalization period ending signal DETC and provides it to the equalization pulse detection portion 200.

The equalization pulse detection portion 200 includes a detection portion 210 for detecting the equalization pulse from the external synchronous signal Csync and the internal synchronous signal Hsync and providing the equalization pulse detection signal DET to the equalization period ending detection portion 400, a control signal generation portion 220 for generating the control signal CS which controls the output of the phase difference detection signal PFD generated from the phase comparison portion 100, to the output selection portion 300 and equalization period ending detection portion 400 according to the equalization pulse detection signal DET from the detection portion 210, and a trigger signal generation portion 230 for generating a trigger signal TRI for triggering the control signal generation portion 220 according to the equalization period ending detection signal DETC generated from the equalization period ending detection portion 400.

Referring to FIG. 3, in the equalization pulse detection portion 200, the detection portion 210 comprises an exclusive OR gate XOR for carrying out an exclusive OR logic of the external synchronous signal Csync and the internal synchronous signal Hsync to generate the equalization pulse detection signal DET. The control signal generation portion 220 comprises a first D flip flop DF1 where the equalization pulse detection signal DET generated from the detection portion 210 is supplied as a clock signal and a power voltage VCC of high level is supplied as an input signal D, an AND gate AN for carrying out an AND logic of the external initial reset signal Freset and the internal synchronous signal Hsync to generate a clear signal to the first D flip flop DF1 and a second flip flop DF2 being triggered by the trigger signal TRI from the trigger signal generation means, 230 where the output signal Q of the first D flip flop DF1 is supplied as a clock signal, the power supply VCC is supplied as an input signal D, and the control signal CS is generated as an output signal Q.

The trigger signal generation portion 230 comprises a third D flip flop DF3 where the equalization period ending detection signal DETC generated from the equalization period ending detection portion 400 is supplied as a clock signal, the power supply VCC is supplied as an input signal D and the trigger signal TRI is generated as an output signal Q and a NAND gate NAN for carrying out a NAND logic of the internal synchronous signal Hsync and the control signal CS to generate a clear signal of the third D flip flop DF3.

Referring to FIG. 3, the output selection portion 300 comprises a multiplexer MUX which outputs the power supply of high level as a masking signal for masking the out of the PFD from the phase comparison portion 100 in the equalization period or otherwise outputs the phase difference detection signal PFD generated from the phase comparison portion 100.

The equalization period ending detection portion 400 divides a master clock signal MCLK by a desired period, for example by 512 to generate the equalization period ending detection signal DETC. The detection portion 400 comprises a counter means for counting the master clock signal MCLK to generate the equalization period ending detection signal DETC. The counter means includes a plurality of D flip flops DF5–DF12 where an inverted output signal Q is fed back to an input signal D. Thus, each of the D flip flops which the output signal Q thereof inverted through the respective inverters IN2–IN9 is fed back to the input signal D thereof, is cleared by the equalization pulse detection signal DET generated from the detection portion 210, is enabled by the control signal CS and is triggered by the inverted output signal in the preceding D flip flop.

The operation of the phase difference detection circuit having the above construction in the PLL circuit for a LCD will be described in detail with reference to FIG. 4A through FIG. 4D.

The phase comparison portion 100 compares a phase between the external synchronous signal Csync and the internal synchronous signal Hsync to detect the phase difference between two synchronous signals and provides the detected phase difference detection signal PFD to the output selection portion 300. At this time, in the non-equalization period of the external synchronous signal Csync, the equalization pulse is not detected and the detection portion 210 generates the equalization pulse detection signal DET of low level to the control signal generation portion 220.

The control signal generation portion 220 generates the control signal of low level through the first and second D flip flops DF1 and DF2 to the output selection portion 300. The output selection portion 300 selects the phase difference detection signal PFD of two input signals which are the power supply VCC and the phase difference detection signal PFD from the phase comparison portion 100 according to the control signal and provides it as an output signal PFD-Cout of the phase difference detection circuit.

On the other hand, in the equalization period of the external synchronous signal Csync, the equalization pulse detection portion 200 receives the external synchronous signal Csync and detection portion 210 detects the equalization pulse through the exclusive OR gate XOR which receives the external synchronous signal Csync of FIG. 4A and the internal synchronous signal Hsync of FIG. 4B and generates the equalization pulse detection signal DET of FIG. 4C to the equalization period ending detection portion 400 and the control signal generation portion 220. The equalization period ending detection portion 400 receives the equalization pulse detection signal DET from the equalization pulse detection portion 200 to clear the plural D flip flops DF4–DF12. The control signal generation portion 220 generates the control signal of high level for masking the output of the phase difference signal PFD through the second D flip flop DF2.

The output selection portion 300 receives the control signal CS of high level as the selection signal of the multiplexer MUX. The multiplexer 300 selects the power supply VCC of two input signals which are power supply signal VCC and the phase difference detection signal PFD and provides it as the output signal PFDCout. The equalization period ending detection portion 400 receives the control signal CS from the control signal generation portion 220 to enable the plural D flip flop DF5–DF12. It counts the master clock signal MCLK by a desired number, for example 512 which is a clock number of 1H(1 horizontal period) and then generates the equalization period ending detection signal DETC to the trigger signal generation portion 230.

The trigger signal generation portion 230 receives the equalization period ending detection signal DETC to generate the trigger signal TRI to the control signal generation portion 220 through the third D flip flop DF3. The control signal generation portion 220 receives the trigger signal TRI from the trigger signal generation portion 230 to clear the second D flip flop DF2. When the equalization period is ended, the second D flip flop DF3 is cleared by the trigger signal TRI to generate the control signal of low level. Accordingly, the output selection portion 300 selects the phase difference detection signal PFD from the phase comparison 100 again and provides it as the output signal PDFCout.

During the equalization period, the phase differenece detection circuit masks the phase difference detection signal PFD generated from the phase comparison 100 and instead provides the power supply VCC of high level as the output signal PFDCout through the output selection portion 300. On the other hand, during the end of the equalization period, it selects the phase difference detection signal PFD and provides it as the output signal PFDCout.

As above described, the phase difference detection circuit for LCDs of the present invention can normally carry out phase difference detection function to be capable of suitably displaying the video signal in receiving the external composite synchronous signal by masking the output of the phase difference detection signal during the equalization period.

The foregoing description shows only a preferred embodiment of the present invention. Various modifications are apparent to those skilled in the art without departing from the scope of the present invention which is only limited by the appended claims. Therefore, the embodiment shown and described is only illustrative, not restrictive.

What is claimed is:

1. A phase difference detection circuit of a phase locked loop (PLL) for a liquid crystal display, which compares a phase between an external synchronous signal and an internal synchronous signal from the PLL to generate a phase difference detection signal, comprising:
   a phase comparison means for comparing the phase between the external synchronous signal and the internal synchronous signal to generate the phase difference detection signal;
   an equalization pulse detection means for detecting an equalization pulse from the external and internal synchronous signals and generating a control signal for controlling the output of the phase difference detection signal from the phase comparison means according to an equalization pulse detection signal;
   an output selection means for masking the phase difference detection signal from the phase comparison means in an equalization period and providing the phase difference detection signal in a non-equalization period according to the control signal received from the equalization pulse detection means; and
   an equalization period ending detection means for detecting an equalization period ending to generate an equalization period ending detection signal to the equalization pulse detection means according to the control signal and the equalization pulse detection signal received from the equalization pulse detection means.

2. The phase difference detection circuit as claimed in claim 1, wherein the equalization pulse detection means includes:
   a detection means for detecting the equalization pulse from the external synchronous signal and the internal synchronous signal and providing the equalization pulse detection signal to the equalization period ending detection means;
   a first generation means for receiving the equalization pulse detection signal received from the detection means to generate the control signal for controlling the output of the phase difference detection signal generated from the phase comparison means to the output selection means and the equalization period ending detection means; and
   a second generation means for receiving the equalization period ending detection signal received from the equalization period ending detection means to generate the a trigger signal for triggering the first generation means.

3. The phase difference detection circuit as claimed in claim 2, wherein the detection means in the equalization pulse detection means comprises an exclusive OR gate for carrying out an exclusive OR logic of the external synchronous signal and the internal synchronous signal to generate the equalization pulse detection signal to the first generation means and the equalization period ending detection means.

4. The phase difference detection circuit as claimed in claim 2, wherein the first generation means includes:
   a first flip flop where the equalization pulse detection signal received from the detection means is supplied as a clock signal and a power voltage is supplied as an input signal;
   an AND gate for carrying out an AND logic of an external reset signal and the internal synchronous signal to generate an output signal for clearing the first flip flop; and
   a second flip flop where an output signal of the first flip flop is supplied as a clock signal, the power supply is supplied as an input signal, the trigger signal received from the second generation means is supplied as a clear signal and the control signal is generated as an output signal to the output selection means and the equalization period ending detection means.

5. The phase difference detection circuit as claimed in claim 4, wherein the second generation means includes:
   a third flip flop where the equalization period ending detection signal is supplied as a clock signal, the power supply is supplied as an input signal and the trigger signal is generated as an output signal to the second flip flop; and
   an NAND gate for carrying out an NAND logic of the internal synchronous signal and the control signal received from the first generation means to generate an output signal for clearing the third flip flop.

6. The phase difference detection circuit as claimed in claim 1, wherein the output selection means comprises a multiplexer which receives a signal for masking the phase difference detection signal generated from the phase comparison means and the phase difference detection signal as two input signals and provides the masking signal in the equalization period or the phase difference detection signal in the non-equalization period as the output signal of the phase difference detection circuit according to the control signal.

7. The phase difference detection circuit as claimed in claim 1, wherein the equalization period ending detection means comprises a counter means for counting the master clock signal received from the PLL by a desired number to generate the equalization period ending detection signal.

8. The phase difference detection circuit as claimed in claim 7, wherein the counter means of the equalization period ending detection means includes a plurality of D filp flops connected in cascade for dividing the master clock signal by 512 to detect the equalization period ending detection signal, each of the D flip flops where an output signal inverted is fed back to an input signal.

9. The phase difference detection circuit as claimed in claim 8, wherein each of the D flip flops where the equalization pulse detection signal received from the equalization pulse detection means is supplied as a clear signal, the control signal is supplied as an enable signal and the output signal inverted of the preceding D flip flop is supplied as a clock signal.

10. A phase difference detection circuit of a phase locked loop (PLL) for a liquid crystal display, which compares a phase between an external synchronous signal and an internal synchronous signal from the PLL to generate a phase difference detection signal, comprising:
a phase comparison means for comparing the phase between the external synchronous signal and the internal synchronous signal to generate the phase difference detection signal;
an equalization pulse detection means for detecting an equalization pulse, the equalization pulse detection means including a detection means for receiving the external and internal synchronous signals to detect the equalization pulse, a control signal generation means for generating a control signal according to an equalization pulse detection signal generated from the detection means, and a trigger signal generation means for receiving an equalization period ending detection signal and the control signal from the control signal generation means to generate a trigger signal for triggering the control signal generation means;
an output selection means for selecting and providing a masking signal for masking an output of the phase difference detection signal generated from the phase comparison means in an equalization period or for selecting and providing the phase difference detection signal in a non-equalization period according to the control signal received from the control signal generation means; and
an equalization period ending detection means for counting a master clock signal from the PLL to detect the equalization period ending and for generating an equalization period ending detection signal to the trigger signal generation means of the equalization pulse detection means, the equalization period ending detection means including a counter means which is cleared by the equalization pulse detection signal generated from the detection means of the equalization pulse detection means and is enabled by the clock signal generated from the control signal generation means.

11. The phase difference detection circuit as claimed in claim 10, wherein the detection means in the equalization pulse detection means comprises an exclusive OR gate for carrying out an exclusive OR logic of the external synchronous signal and the internal synchronous signal to generate the equalization pulse detection signal to the control signal generation means and the equalization period ending detection means.

12. The phase difference detection circuit as claimed in claim 10, wherein the control signal generation means includes:
a first flip flop where the equalization pulse detection signal received from the detection means is supplied as a clock signal and a power voltage is supplied as an input signal;
an AND gate for carrying out an AND logic of an external reset signal and the internal synchronous signal to generate an output signal for clearing the first flip flop; and
a second flip flop where an output signal of the first flip flop is supplied as a clock signal, the power supply is supplied as an input signal, the trigger signal received from the trigger signal generation means is supplied as a clear signal and the control signal is generated as an output signal to the output selection means and the equalization period ending detection means.

13. The phase difference detection circuit as claimed in claim 12, wherein the trigger signal generation means includes:
a third flip flop where the equalization period ending detection signal is supplied as a clock signal, the power supply is supplied as an input signal and the trigger signal is generated as an output signal to the second flip flop; and
an NAND gate for carrying out an NAND logic of the internal synchronous signal and the control signal received from the control signal generation means to generate an output signal for clearing the third D flip flop.

14. The phase difference detection circuit as claimed in claim 10, wherein the output selection means comprises a multiplexer which receives a signal for masking the phase difference detection signal generated from the phase comparison means and the phase difference detection signal as two input signals and provides the masking signal in the equalization period or the phase difference detection signal in the non-equalization period as the output signal of the phase difference detection circuit according to the control signal received from the control signal generation means.

15. The phase difference detection circuit as claimed in claim 10, wherein the equalization period ending detection means comprises a counter means for counting the master clock signal received from the PLL by a desired number to generate the equalization period ending detection signal.

16. The phase difference detection circuit as claimed in claim 15, wherein the counter means of the equalization period ending detection means includes a plurality of D filp flops connected in cascade for dividing the master clock signal by 512 to the equalization period ending detection signal, each of the D flip flops where an output signal inverted is fed back to an input signal.

17. The phase difference detection circuit as claimed in claim 16, wherein each of the D flip flops where the equalization pulse detection signal from the detection means is supplied as a clear signal, the control signal is supplied as an enable signal and the output signal inverted of the preceding D flip flop is supplied as a clock signal.

18. A phase difference detection circuit of a phase locked loop (PLL) for a liquid crystal display, which compares a phase between an external synchronous signal and an internal synchronous signal from the PLL to generate a phase difference detection signal, comprising:
a phase comparison means for comparing the phase between the external synchronous signal and the internal synchronous signal to generate the phase difference detection signal;
an equalization pulse detection means for detecting an equalization pulse from the external and internal synchronous signals and generating a control signal for controlling the output of the phase difference detection signal from the phase comparison means according to an equalization pulse detection signal;

an output selection means for selecting and providing an external masking signal for masking the output of the phase difference detection signal from the phase comparison means in an equalization period or selecting and providing the phase difference detection signal in a non-equalization period according to the control signal form the equalization pulse detection means; and an equalization period ending detection means for counting a master clock signal from the PLL to detect an equalization period ending and providing an equalization period ending detection signal to the equalization pulse detection means according to the control signal and the equalization pulse detection signal from the equalization pulse detection means;

wherein in starting of the equalization period of the external synchronous signal, the equalization pulse detection means generates the equalization pulse detection signal for clearing the equalization period ending detection means and then generates the control signal to the output selection means and the equalization period ending detection means, thereby generating the masking signal through the output selection means and enabling the equalization period ending detection means, and in ending of the equalization period of the external synchronous signal, the equalization period ending detection means generates the equalization period ending detection signal to the equalization pulse detection means and then the equalization pulse detection means generates the control signal, thereby generating the phase difference detection signal through the output selection means.

* * * * *